(12) United States Patent
Long et al.

(10) Patent No.: US 11,597,352 B2
(45) Date of Patent: Mar. 7, 2023

(54) GLASS, AND MANUFACTURING METHOD AND CONTROL METHOD THEREOF

(71) Applicants: Beijing BOE Optoelectronics Technology Co., Ltd., Beijing (CN); BOE Technology Group Co., Ltd., Beijing (CN)

(72) Inventors: Jun Long, Beijing (CN); Yong Song, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 638 days.

(21) Appl. No.: 16/521,210

(22) Filed: Jul. 24, 2019

(65) Prior Publication Data
US 2020/0031316 A1    Jan. 30, 2020

(30) Foreign Application Priority Data
Jul. 26, 2018 (CN) .......................... 201810836231.4

(51) Int. Cl.
*B60S 1/02* (2006.01)
*H01L 31/048* (2014.01)
(Continued)

(52) U.S. Cl.
CPC .......... *B60S 1/026* (2013.01); *H01L 31/0488* (2013.01); *H05B 3/86* (2013.01);
(Continued)

(58) Field of Classification Search
CPC ......... Y02T 10/7005; H02J 7/35; H02J 3/383; H01L 27/142; H01L 31/02021;
(Continued)

(56) References Cited

U.S. PATENT DOCUMENTS

| 9,978,412 B1 * | 5/2018 | Macken ................. G11B 5/314 |
| 2012/0291841 A1 * | 11/2012 | Jang ..................... H01L 31/042 136/244 |

(Continued)

FOREIGN PATENT DOCUMENTS

| CN | 101699634 A | * | 4/2010 |
| CN | 101699634 A | | 4/2010 |
| CN | 203351626 U | | 12/2013 |
| CN | 103533686 A | | 1/2014 |

(Continued)

OTHER PUBLICATIONS

Machine translation of CN-204103852-U, Yu X. (Year: 2015).*
(Continued)

*Primary Examiner* — Mayla Gonzalez Ramos
(74) *Attorney, Agent, or Firm* — Nath, Goldberg & Meyer; Joshua B. Goldberg

(57) ABSTRACT

The present disclosure provides glass, and a manufacturing method and a control method thereof. The glass includes a first glass layer, a plurality of transparent conductive strips and a second glass layer. The plurality of transparent conductive strips are between the first glass layer and the second glass layer, and are configured to generate heat when being supplied with power.

17 Claims, 5 Drawing Sheets

(51) Int. Cl.
 *H05B 3/86* (2006.01)
 *H01L 31/05* (2014.01)
 *H01L 31/075* (2012.01)

(52) U.S. Cl.
 CPC ..... *B60Y 2400/216* (2013.01); *H01L 31/0504* (2013.01); *H01L 31/075* (2013.01)

(58) Field of Classification Search
 CPC ............. H01L 31/0488; H01L 31/0504; H01L 31/075; H05B 3/86; B60S 1/026; Y02E 10/50; Y02E 10/563; B60Y 2400/216
 See application file for complete search history.

(56) References Cited

U.S. PATENT DOCUMENTS

| | | | |
|---|---|---|---|
| 2014/0041713 A1* | 2/2014 | Adler | H05B 3/26 136/251 |
| 2019/0214518 A1* | 7/2019 | Koizumi | H01L 31/049 |

FOREIGN PATENT DOCUMENTS

| | | | | |
|---|---|---|---|---|
| CN | 103921506 A | | 7/2014 | |
| CN | 204103852 U | * | 1/2015 | |
| CN | 205508831 U | | 8/2016 | |
| CN | 108198882 A | * | 6/2018 | |
| JP | 08260638 A | * | 10/1996 | ............. H02S 40/12 |
| WO | 2017200242 A2 | | 11/2017 | |

OTHER PUBLICATIONS

Machine translation of JP-08260638-A, Iijima M. (Year: 1996).*
Machine translation of CN-101699634-A, Huang J. (Year: 2010).*
Yantao Liu, Wei Ren, Peng Shi, Dan Liu, Yijun Zhang, Ming Liu, "A Highly Thermostable In2O3/ITO Thin Film Thermocouple Prepared via Screen Printing for High Temperature Measurements", Sensors 2018, 18, 958; doi:10.3390/s18040958. (Year: 2018).*
Machine translation of CN-108198882-A, Feng Z. (Year: 2018).*
First Office Action dated Mar. 2, 2020 for corresponding Chinese application 201810836231.4.
Second Office Action dated Sep. 25, 2020, for corresponding Chinese application No. 201810836231.4.

* cited by examiner

A-A section

B-B section

C-C section

GLASS, AND MANUFACTURING METHOD AND CONTROL METHOD THEREOF

CROSS-REFERENCE TO RELATED APPLICATION

This application claims the benefit of priority to Chinese Patent Application No. 201810836231.4 filed on Jul. 26, 2018, the contents of which are incorporated herein by reference in their entirety.

TECHNICAL FIELD

The present disclosure relates to the technical field of glass, and in particular, to glass, and a manufacturing method and a control method thereof.

BACKGROUND

The existing vehicle windshields generally include front windshields and rear windshields, and both of them are made of ordinary glass. The front windshields are generally made of full transparent glass, and the rear windshields are generally made of glass attached with spaced black thermal resistance wires.

SUMMARY

One aspect of the present disclosure provides glass. The glass includes a first glass layer, a plurality of transparent conductive strips and a second glass layer, wherein the plurality of transparent conductive strips are between the first glass layer and the second glass layer and spaced apart from each other, and are configured to generate heat when being supplied with power.

According to an embodiment of the present disclosure, the glass further includes a solar power unit between the plurality of transparent conductive strips and at least one of the first glass layer and the second glass layer.

According to an embodiment of the present disclosure, the solar power unit includes a first electrode, a second electrode and a PIN junction between the first electrode and the second electrode.

According to an embodiment of the present disclosure, the glass includes a plurality of solar power units, wherein the plurality of solar power units are arranged in an array of m rows and n columns, n solar power units in each row are coupled in series as a solar power unit string, m solar power unit strings are coupled in parallel with each other, and both m and n are natural numbers.

According to an embodiment of the present disclosure, the solar power unit is coupled to at least one of a power storage element or a power consumption element.

According to an embodiment of the present disclosure, the solar power unit is coupled to the plurality of transparent conductive strips.

According to an embodiment of the present disclosure, the glass further includes a transparent insulating layer between the solar power unit and the plurality of transparent conductive strips.

According to an embodiment of the present disclosure, the glass further includes a temperature measuring structure on an edge of the glass, wherein the temperature measuring structure includes a first transparent conductive temperature measuring strip and a second transparent conductive temperature measuring strip which are made of different conductive materials, one end of the first transparent conductive temperature measuring strip and one end of the second transparent conductive temperature measuring strip are overlapped and coupled.

According to an embodiment of the present disclosure, the first transparent conductive temperature measuring strip is made of Indium Tin Oxide (ITO), and the second transparent conductive temperature measuring strip is made of Antimony Tin Oxide (ATO).

According to an embodiment of the present disclosure, the plurality of transparent conductive strips are made of ITO.

According to an embodiment of the present disclosure, the glass further includes a control circuit, wherein the control circuit is coupled to a power source and the temperature measuring structure, and the control circuit is configured to perform at least one of steps of: controlling the power source to apply a first type of control voltage to the plurality of transparent conductive strips to cause the plurality of transparent conductive strips to generate heat, controlling the power source to apply a second type of control voltage to the plurality of transparent conductive strips to cause the plurality of transparent conductive strips to generate a strong and weak alternating electric field, and controlling a magnitude of a control voltage applied to the plurality of transparent conductive strips according to a temperature of the glass measured by the temperature measuring structure.

According to an embodiment of the present disclosure, the plurality of transparent conductive strips have a curved shape, and at least one of the first transparent conductive temperature measuring strip and the second transparent conductive temperature measuring strip has a same shape as the plurality of transparent conductive strips.

Another aspect of the present disclosure provides a manufacturing method of glass. The manufacturing method includes forming a first glass layer; forming a plurality of transparent conductive strips on the first glass layer; and forming a second glass layer on a side of the plurality of transparent conductive strips away from the first glass layer, wherein the plurality of transparent conductive strips are spaced apart from each other, and are configured to generate heat when being supplied with power.

According to an embodiment of the present disclosure, after forming the plurality of transparent conductive strips on the first glass layer, the manufacturing method further includes forming a solar power unit on the side of the plurality of transparent conductive strips away from the first glass layer.

According to an embodiment of the present disclosure, forming the solar power unit includes forming a first electrode on the side of the plurality of transparent conductive strips away from the first glass layer; forming a PIN junction on a side of the first electrode away from the plurality of transparent conductive strips; and forming a second electrode on a side of the PIN junction away from the first electrode.

According to an embodiment of the present disclosure, forming the solar power unit includes forming a plurality of solar power units, wherein the plurality of solar power units are arranged in an array of m rows and n columns, n solar power units in each row are coupled in series as a solar power unit string, m solar power unit strings are coupled in parallel with each other, and both m and n are natural numbers.

According to an embodiment of the present disclosure, the manufacturing method further includes forming a temperature measuring structure on an edge of the glass, wherein forming the temperature measuring structure includes forming a first transparent conductive temperature measuring strip and a second transparent conductive temperature measuring strip from different conductive materials, one end of the first transparent conductive temperature measuring strip and one end of the second transparent conductive temperature measuring strip being overlapped and coupled.

Another aspect of the present disclosure provides a control method of glass, wherein the glass includes a first glass layer, a plurality of transparent conductive strips and a second glass layer, the plurality of transparent conductive strips are located between the first glass layer and the second glass layer and spaced apart from each other, and the control method includes controlling a power source to apply a first type of control voltage to the plurality of transparent conductive strips to cause the plurality of transparent conductive strips to generate heat; and controlling the power source to apply a second type of control voltage to the plurality of transparent conductive strips to cause the plurality of transparent conductive strips to generate a strong and weak alternating electric field.

According to an embodiment of the present disclosure, the glass further includes a temperature measuring structure, and the control method further includes controlling a magnitude of a control voltage applied to the plurality of transparent conductive strips according to a temperature of the glass measured by the temperature measuring structure.

According to an embodiment of the present disclosure, the control method further includes disconnecting the power source from the plurality of transparent conductive strips, and coupling a solar power unit to a power storage element or a power consumption element; applying a first type of control voltage to the plurality of transparent conductive strips by the power storage element or other power supply element to cause the plurality of transparent conductive strips to generate heat, and applying a second type of control voltage to the plurality of transparent conductive strips by the power storage element or other power supply element to cause the plurality of transparent conductive strips to generate a strong and weak alternating electric field.

BRIEF DESCRIPTION OF THE DRAWINGS

FIG. 1b is a cross-sectional view taken along line A-A of the glass of FIG. 1a;

FIG. 1c is a cross-sectional view taken along line B-B of the glass of FIG. 1a;

FIG. 1d is a cross-sectional view taken along line C-C of the glass of FIG. 1a;

FIG. 4 is another cross-sectional view taken along the line A-A of the glass of FIG. 1a;

DETAILED DESCRIPTION

The objects, technical solutions and advantages of the present disclosure will become more apparent from the following detailed description of specific embodiments of the present disclosure in conjunction with accompanying drawings.

It should be noted that expressions containing "first" and "second" in the embodiments of the present disclosure are used to distinguish between two non-identical entities or parameters having a same name. Accordingly, the expressions containing "first" and "second" are merely for convenience of description, and should not be construed as limiting the embodiments of the present disclosure, which will not be explained in the following embodiments.

The existing front windshields are generally made of full transparent glass, and are easy to frost up and fog in a frosty, foggy and/or rainy weather, which makes a driver in a vehicle hard to observe clearly, so that the driver has to manually clean the front windshields or increase a temperature of an air conditioner in the vehicle to remove frost and fog. However, those defrosting and defogging ways cannot produce good effects and are not safe. The existing rear windshields are defrosted and defogged by being heated with spaced black thermal resistance wires attached thereto, but such arrangement of attaching the black thermal resistance wires to the rear windshield may greatly reduce a visual observation area of the rear windshield, which will greatly affect the driver's observation of the rear of the vehicle, and even cause traffic accidents in some cases. Besides, since there is no temperature feedback in such arrangement, temperature adjustments are inconvenient and inaccurate during the heating process. That is, the existing windshield defrosting and defogging ways for the vehicles cannot produce good effects, and are potentially dangerous.

Figure 1A:
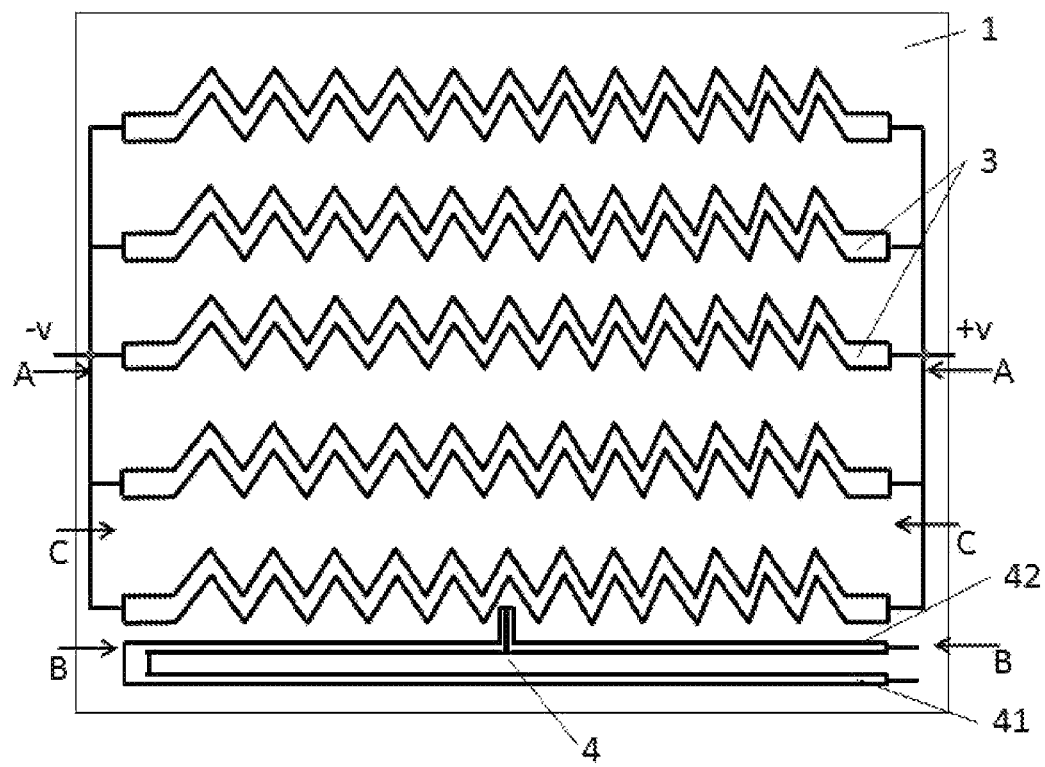
FIG. 1a is a schematic structural diagram of glass according to an embodiment of the present disclosure.
Figure 1B:
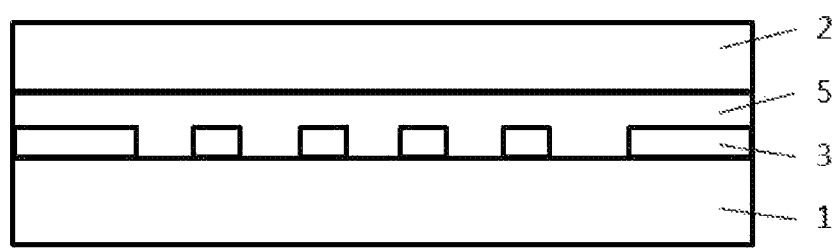
Figure 1C:
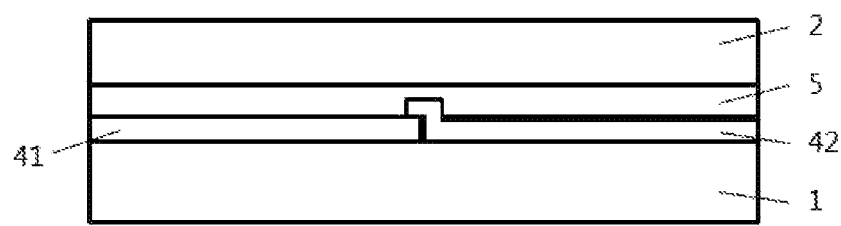
Figure 1D:
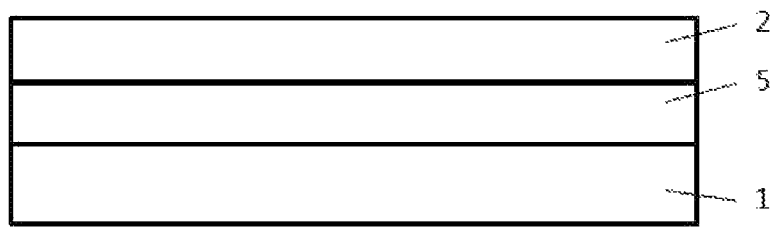

FIG. 1a is a schematic structural diagram of glass according to an embodiment of the present disclosure, FIG. 1b is a cross-sectional view taken along line A-A of the glass of FIG. 1a, FIG. 1c is a cross-sectional view taken along line B-B of the glass of FIG. 1a, and FIG. 1d is a cross-sectional view taken along line C-C of the glass of FIG. 1a.

Referring to FIGS. 1a to 1d, the glass according to the embodiment of the present disclosure includes: a first glass layer 1, a plurality of transparent conductive strips 3 and a second glass layer 2, wherein the plurality of transparent conductive strips 3 are disposed between the first glass layer 1 and the second glass layer 2 and spaced apart from each other, and are configured to generate heat when being supplied with power.

According to an embodiment of the present disclosure, two common ends of the plurality of transparent conductive strips 3 are led out and respectively coupled to a positive electrode and a negative electrode of a power source, which is used for supplying power to the plurality of transparent conductive strips 3. The power source may be a battery, a storage battery or other power supply devices arranged on an edge of the glass, or may be other power supply devices coupled to the vehicle from outside, which is not limited in this embodiment.

According to an embodiment of the present disclosure, a material of the plurality of transparent conductive strips 3 may be ITO (Indium Tin Oxide), but embodiments of the present disclosure are not limited thereto, so that the plurality of transparent conductive strips 3 may further be made of other materials.

By disposing the plurality of transparent conductive strips 3 between the first glass layer and the second glass layer and coupling the plurality of transparent conductive strips 3 to the power source, the plurality of transparent conductive strips 3 may be heated by the power source to achieve defrosting and defogging effects, without affecting the driver's sight and the windshield's transparency. Therefore, the present disclosure may guarantee accurate and effective defrosting and defogging effects under a condition that the driver has a good view.

The plurality of transparent conductive strips 3 ensure that there are a plurality of heat sources between the first glass layer and the second glass layer, which may increase a heating area and realize uniform heating of the glass, thereby improving the defrosting and defogging effects. In addition, the plurality of transparent conductive strips 3 may also support the glass, so as to make the glass firmer.

It should be noted that the glass according to the embodiment of the present disclosure may be used as at least one of a vehicle rear windshield, a vehicle front windshield and a vehicle door glass, and may also be used as windshields of other driving equipment (such as airplanes, ships, trains and the like), or as a window glass.

Figure 2:
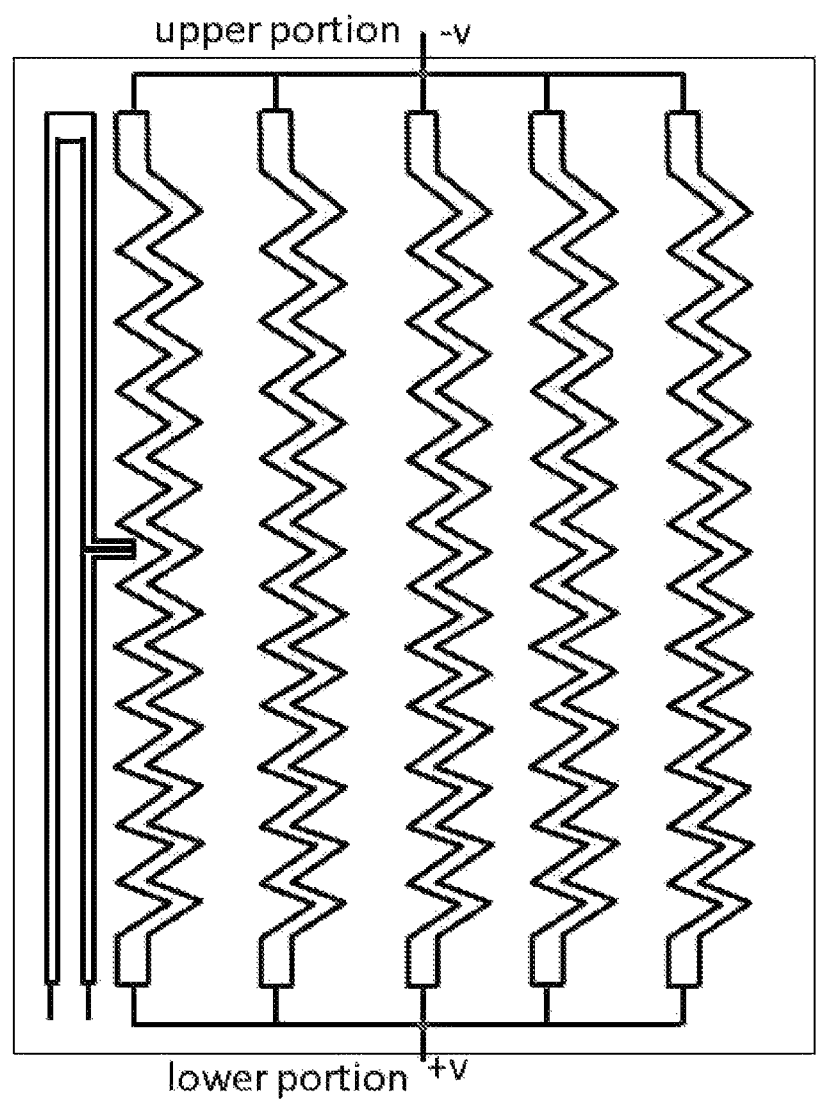
FIG. 2 is another schematic structural diagram of glass according to an embodiment of the present disclosure.

According to an embodiment of the present disclosure, FIG. 1a shows that the plurality of transparent conductive strips 3 are disposed longitudinally, but the embodiments of the present disclosure are not limited thereto, for example, as shown in FIG. 2, the plurality of transparent conductive strips 3 may be disposed horizontally.

Figure 3:
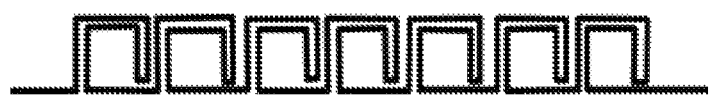
FIG. 3 is a schematic diagram of a shape of a transparent conductive strip according to an embodiment of the present disclosure.

As shown in FIGS. 1a and 2, each of the plurality of transparent conductive strips 3 is provided in a zigzag curved shape, but the curved shape of the transparent conductive strip according to an embodiment of the present disclosure is not limited thereto, and the shape of the transparent conductive strip may further include other shapes, such as a sinusoidal shape. For example, FIG. 3 shows a curved shape of a transparent conductive strip. As shown in FIG. 3, the transparent conductive strip first extends horizontally from left to right, and then is bent upward, rightward, and downward sequentially to form a shape similar to a square shape having no bottom edge, and then the transparent conductive strip is bent inward in a direction substantially parallel to the above-described bending curve to form a double-layered curved shape similar to a square shape having no bottom edge, and continues to horizontally extend to the right and to be bent in the above manner. The horizontal direction and the extending direction in the above description are only referred to for explaining the curved shape of the transparent conductive strip, and the horizontal direction and the extending direction may be any other directions.

By setting the transparent conductive strips 3 in the curved shape, lengths of the transparent conductive strips 3 may be increased and the heating area may be increased accordingly, which facilitates dissipation of heat generated by the transparent conductive strips 3 into the glass, and also improves stability of coupling between the transparent conductive strips 3 and the glass.

Referring to FIGS. 1a and 1c, the glass according to an embodiment of the present disclosure may further include a temperature measuring structure 4 disposed on an edge of the glass, which includes a first transparent conductive temperature measuring strip 41 and a second transparent conductive temperature measuring strip 42. The first transparent conductive temperature measuring strip 41 and the second transparent conductive temperature measuring strip 42 are made of different conductive materials. One end of the first transparent conductive temperature measuring strip 41 and one end of the second transparent conductive temperature measuring strip 42 are overlapped and coupled. For example, the temperature measuring structure 4 may be a thin film thermocouple thermometer, in which case two respective ends of two different conductive materials are overlapped and coupled to form a closed loop, and the overlapped and coupled ends will generate different electromotive forces in presence of a temperature change due to different temperature characteristics of the two conductive materials, so that an electromotive force will be generated in the closed loop. With different temperatures, the electromotive force generated in the closed loop differs accordingly, which enables the thin film thermocouple thermometer to achieve an effect of measuring temperature. The above thin film thermocouple thermometer is merely an example, and the embodiments of the present disclosure may also include other types of temperature measuring structures.

According to an embodiment of the present disclosure, a material of the first transparent conductive temperature measuring strip 41 is ITO, and a material of the second transparent conductive temperature measuring strip 42 is ATO (Antimony Tin Oxide). The above materials are merely examples, and the present disclosure is not limited thereto, so that the first transparent conductive temperature measuring strip 41 and the second transparent conductive temperature measuring strip 42 may employ any material capable of measuring temperatures.

According to an embodiment of the present disclosure, the glass may further include a control circuit coupled to the power source and the temperature measuring structure 4. For example, the other end of the first transparent conductive temperature measuring strip 41 and the other end of the second transparent conductive temperature measuring strip 42 in the temperature measuring structure 4, which are not overlapped and coupled with each other, are separately led out and coupled to the control circuit.

According to the embodiment of the present disclosure, a temperature value of the glass heated by the plurality of transparent conductive strips 3 may be monitored according to temperature measurement of the temperature measuring structure 4 during defrosting and defogging. Thus, heating control may be conducted more accurately, so as to ultimately improve the defrosting and defogging effects. Moreover, a temperature of the glass may be monitored while the vehicle is exposed under the sun, so as to provide a condition monitoring for the safe of the vehicle.

At least one of the first transparent conductive temperature measuring strip 41 and the second transparent conductive temperature measuring strip 42 in the temperature measuring structure 4 may be disposed to have the same shape as the plurality of transparent conductive strips 3 and have no contact with the plurality of transparent conductive strips 3, thereby increasing a relative "contact" area between the temperature measuring structure 4 and the plurality of transparent conducting strips 3, so that an effect of measuring temperatures may be improved. Meanwhile, the temperature measuring structure 4 may seal the edge of the glass to prevent the heat from dissipating to the edge of the glass, which avoids waste of the heat, damages made by the heat to components disposed close to the edge and subsequent effects on service lives of the components. In some embodiments, an overlapped and coupled portion of the first transparent conductive temperature measuring strip 41 and the second transparent conductive temperature measuring strip 42 may be disposed to have the same shape as the plurality of transparent conductive strips 3. It should be noted that a structure of the overlapped and coupled portion of the first transparent conductive temperature measuring strip 41 and the second transparent conductive temperature measuring strip 42 may be a structure as shown in FIG. 1c, or may be other overlapped structures, which is not limited by this embodiment.

According to an embodiment of the present disclosure, the control circuit may control the power source to apply a first type of control voltage to the plurality of transparent conductive strips to make the plurality of transparent conductive strips generate heat, control the power source to apply a second type of control voltage to the plurality of transparent conductive strips to make the plurality of transparent conductive strips generate a strong and weak alternating electric field, and control a magnitude of the voltage applied to the plurality of transparent conductive strips by the power source according to the temperature of the glass measured by the temperature measuring structure 4.

For example, the control circuit may control the power source to apply a voltage or a current to the plurality of transparent conductive strips 3 according to an environment outside the glass. For example, when the environment outside the glass is frosty and foggy, the control circuit controls the power source to apply a first type of control voltage, for example, a direct current voltage, to the plurality of transparent conductive strips 3, so that the plurality of transparent conductive strips 3 may generate heat to defrost and defog; and when the environment outside the glass is rainy, the control circuit controls the power source to apply a second type of control voltage, for example, a PWM (Pulse Width Modulation) model micro-control voltage, to the plurality of transparent conductive strips 3, so that the plurality of transparent conductive strips 3 may generate a strong and weak alternating electric field under which rainwater on the glass may generate an electrowetting-on-dielectric effect, thereby accelerating a flow speed of the rainwater.

According to an embodiment of the present disclosure, the control circuit may control a magnitude of the voltage or current applied to the plurality of transparent conductive strips 3 by the power source according to the temperature of the glass measured by the temperature measuring structure 4. For example, if the temperature measured after the plurality of transparent conductive strips 3 generate heat does not fall within a desired temperature range, the control circuit may further control the power source to increase the magnitude of the voltage or current, so that a heating temperature of the plurality of transparent conductive strips 3 may reach a desired temperature. In this way, more accurate defrosting and defogging effects can be achieved by a combination of heating and temperature measurement.

According to an embodiment of the present disclosure, the control circuit may display the temperature measured by the temperature measuring structure to a user, and control the types of the voltage or current applied by the power source to the plurality of transparent conductive strips according to a user's input, and further control the magnitude of the voltage or current applied by the power source to the plurality of transparent conductive strips according to the user's input. The user's input may be a user's touch input on an on-vehicle display, a user's voice input and the like.

According to an embodiment of the present disclosure, the control circuit may be disposed inside the glass or on an edge of the glass, or may be led out of the glass by wires.

According to an embodiment of the present disclosure, a transparent insulating layer 5 may be disposed between the plurality of transparent conductive strips 3 and the second glass layer 2 and in gaps between the plurality of transparent conductive strips 3. The transparent insulating layer 5 may be a passivation layer (PVX). The PVX is merely an example, and the present disclosure is not limited thereto, and the transparent insulating layer 5 may be made of other insulating materials.

Figure 4:
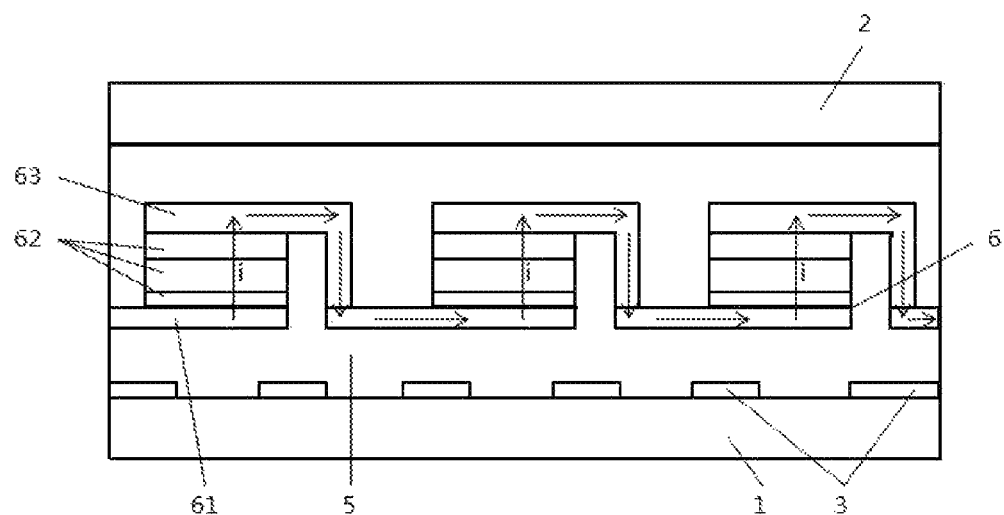

FIG. 4 is another cross-sectional view taken along the line A-A of the glass of FIG. 1a.

Referring to FIG. 4, the glass further includes solar power units 6 disposed between the plurality of transparent conductive strips 3 and the first glass layer 1 or between the plurality of transparent conductive strips 3 and the second glass layer 2, as compared with the cross-sectional view taken along the line A-A shown in FIG. 1b. FIG. 4 shows that the solar power units 6 are disposed between the plurality of transparent conductive strips 3 and the second glass layer 2.

Each of the solar power units 6 includes a positive electrode 61, a PIN junction 62, and a negative electrode 63. The PIN junction 62 is disposed between the positive electrode 61 and the negative electrode 63, one end of the PIN junction 62 is coupled to the positive electrode 61, and the other end of the PIN junction 62 is coupled to the negative electrode 63. A transparent insulating layer 5 is disposed between the solar power units 6 and the plurality of transparent conductive strips 3. The transparent insulating layer 5 is a passivation layer (PVX), for example. Positions of the positive electrode 61 and the negative electrode 63 may be interchanged, and are not limited to the positions shown in FIG. 4.

According to the embodiment of the present disclosure, by disposing the solar power units 6 in the glass, conversion of solar energy may be realized. In addition to using solar energy to generate electricity, the glass can also reduce a high temperature generated by the sunlight illumination on the vehicle in a high temperature weather through the plurality of transparent conductive strips 3, so as to avoid an excessive temperature inside the vehicle and adverse effects of the high temperature on sight of the driver in the vehicle.

Figure 5:
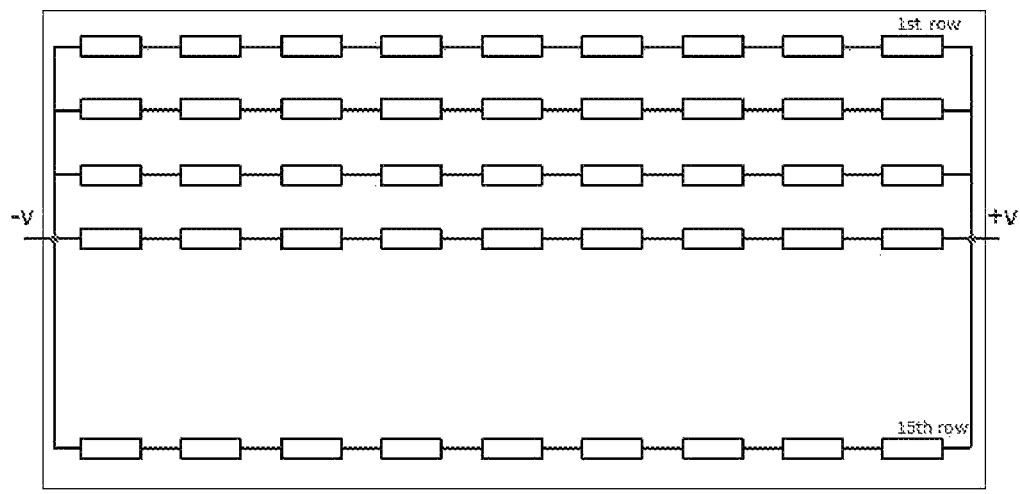
FIG. 5 is a schematic structural diagram illustrating coupling of solar power units according to an embodiment of the present disclosure.

FIG. 5 is a schematic structural diagram illustrating coupling of the solar power units according to an embodiment of the present disclosure.

Referring to FIG. 5, according to an embodiment of the present disclosure, the solar power units 6 are disposed in an array, for example, the solar power units 6 are disposed in an array of m rows and n columns, n solar power units 6 in each row are coupled in series as a solar power unit string, so as to form m solar power unit strings, and m solar power unit strings are coupled in parallel, wherein both m and n are arbitrary natural numbers and may be changed according to a size of the glass. In this case, adjacent PIN junctions included in adjacent solar power units may be coupled in series by coupling the positive electrode to the negative electrode, or be coupled in parallel by coupling the positive electrode to the positive electrode and coupling the negative electrode to the negative electrode. Such arrangement may not only increase a light receiving area, but also contribute to stability of an overall structure of multi-layer glass.

Such arrangement may not only improve solar energy conversion efficiency, but also, with the parallel connection, avoid failure of all the solar power units 6 caused when a certain solar power unit string is damaged.

Figure 6:
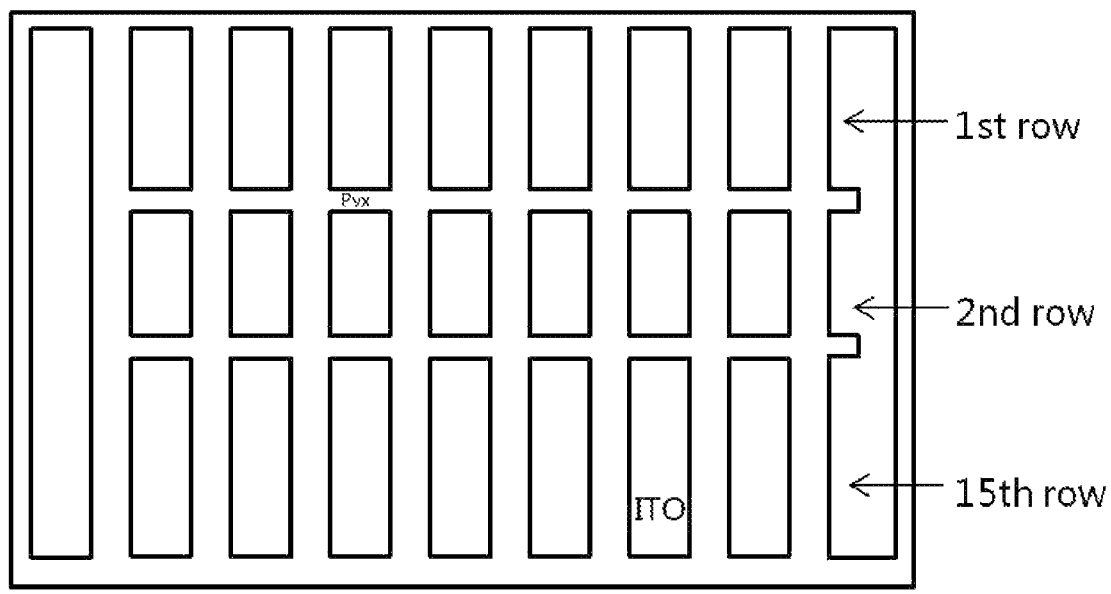
FIG. 6 is a schematic structural diagram of a layer of positive electrodes according to an embodiment of the present disclosure.
Figure 7:
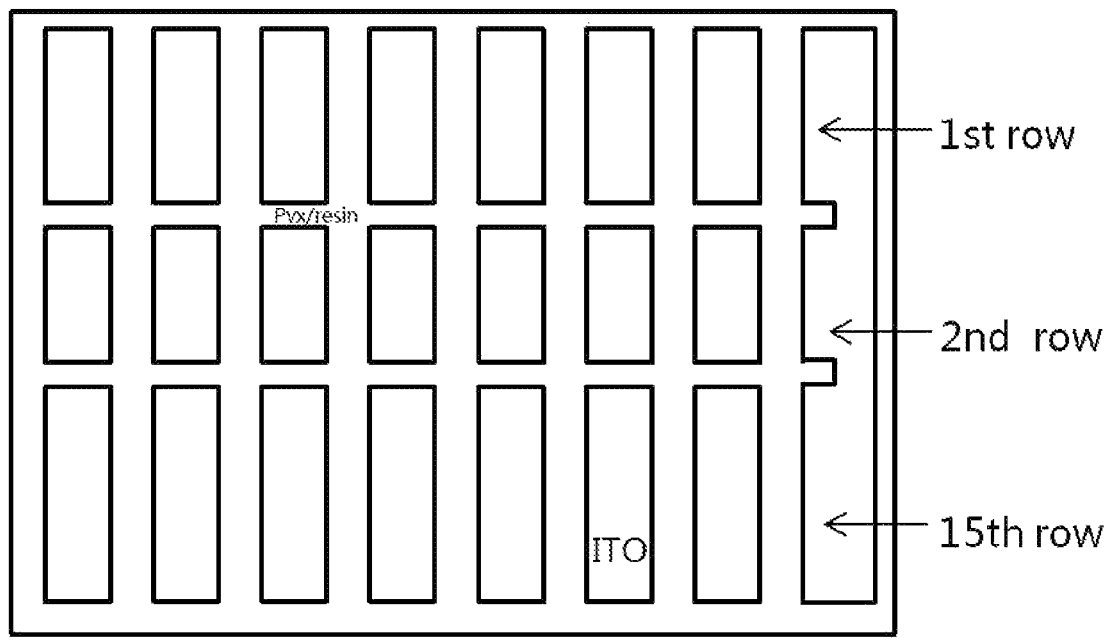
FIG. 7 is a schematic structural diagram of a layer of negative electrodes according to an embodiment of the present disclosure.

The positive electrodes, the PIN junctions and the negative electrodes included in the solar power units 6 are also in an array distribution corresponding to that of the solar power units 6. For example, FIG. 6 shows an array distribution of the positive electrodes, and FIG. 7 shows an array distribution of the negative electrodes.

According to an embodiment of the present disclosure, the solar power units 6 may be coupled to power storage elements or power consumption elements. For example, the solar power units 6 may be coupled to the plurality of transparent conductive strips 3 which function as power consumption elements, such that the solar power units 6 may supply power to the plurality of transparent conductive strips 3. In addition, the power consumption elements may be external power consumption units in any form, and are not limited to the plurality of transparent conductive strips 3. For example, the solar power units 6 may be electrically connected to a storage battery which functions as a power storage element, and the storage battery may be an externally coupled storage battery in any form, or a storage battery for supplying power to the plurality of transparent conductive strips 3 which is equivalent to the power source for the plurality of transparent conductive strips 3.

The present disclosure further provides a control method of the above-mentioned glass including the temperature measuring structure. The method includes controlling a power source to apply a first type of control voltage to the plurality of transparent conductive strips to make the plurality of transparent conductive strips generate heat, controlling the power source to apply a second type of control voltage to the plurality of transparent conductive strips to make the plurality of transparent conductive strips generate a strong and weak alternating electric field, controlling types and magnitudes of the voltages applied by the power source to the plurality of transparent conductive strips according to a temperature of the glass measured by the temperature measuring structure, and controlling the types and the magnitudes of the voltages applied to the plurality of transparent conductive strips according to a user's input.

The present disclosure further provides a control method of the above-mentioned glass including the temperature measuring structure and the solar power units. The method includes disconnecting the power source from the plurality of transparent conductive strips, and coupling the solar power units to a power storage element to store electrical energy generated by the solar power units in the power storage element, or coupling the solar power units to a power consumption element other than the plurality of transparent conductive strips; applying a first type of control voltage to the plurality of transparent conductive strips by the power storage element or a power supply element to make the plurality of transparent conductive strips generate heat; applying a second type of control voltage to the plurality of transparent conductive strips by the power storage element or the power supply element to make the plurality of transparent conductive strips generate a strong and weak alternating electric field; controlling types and magnitudes of the voltages applied to the plurality of transparent conductive strips according to a temperature of the glass measured by the temperature measuring structure; and controlling the types and the magnitudes of the voltages applied to the plurality of transparent conductive strips according to a user's input.

For example, if the environment outside the glass is sunny, power supply to the plurality of transparent conductive strips 3 may be stopped, and the solar power units are coupled to a power storage element or a power consumption element other than the plurality of transparent conductive strips 3. For example, a control switch may be provided between the plurality of transparent conductive strips 3 and the power source, so that the power supply to the plurality of transparent conductive strips 3 may be stopped by switching off the control switch. If the environment outside the glass is frosty and foggy, the plurality of transparent conductive strips 3 may be applied with a first type of control voltage, for example, a direct current voltage, so that the plurality of transparent conductive strips 3 may generate heat to defrost and defog. Furthermore, a magnitude of the voltage applied by the power source may be changed according to a temperature signal acquired by the temperature measuring structure to achieve desired defrosting and defogging effects. If the environment outside the glass is rainy, the plurality of transparent conductive strips 3 may be applied with a second type of control voltage, for example, a PWM model micro-control voltage, so that the plurality of transparent conductive strips 3 may generate a strong and weak alternating electric field under which rainwater may generate an electrowetting-on-dielectric effect, thereby accelerating a flow speed of the rainwater.

According to an embodiment of the present disclosure, the magnitude of the voltage applied to the plurality of transparent conductive strips 3 may be adjusted according to a need to defrost and defog or remove the rainwater.

According to an embodiment of the present disclosure, the type and the magnitude of the control voltage applied to the plurality of transparent conductive strips 3 may be controlled according to a user's input.

Therefore, the above-mentioned glass is a new type of integrated solar glass having automatic heating, defrosting and defogging, and rainwater removing functions, and may operate in a plurality of working modes: (1) a solar energy conversion mode applied in a sunny weather, in which solar energy is converted into electric energy through the solar power units; (2) a defrosting and defogging mode applied in a frosty and foggy weather, in which a direct current voltage is applied to the plurality of transparent conductive strips 3 in the glass with the control circuit to make the plurality of transparent conductive strips 3 generate heat, and the control circuit controls the magnitude of the voltage applied to the plurality of transparent conductive strips 3 according to the temperature measured by the temperature measuring structure to ensure optimal defrosting/defogging and energy-saving effects; and (3) a rainwater removing mode applied in a rainy weather, in which a voltage having a PWM mode is applied to the plurality of transparent conductive strips 3, so that the plurality of transparent conductive strips 3 may generate a strong and weak alternating electric field under which rainwater droplets may generate an electrowetting-on-dielectric effect, thereby accelerating downward flow speeds of the droplets and improving the rainwater removing effect.

It should be understood by those skilled in the art that the discussion of any of the above embodiments is merely exemplary, and is not intended to limit the scope of the present disclosure. Without departing from the scope and spirit of the present disclosure, the technical features in the above embodiments or different embodiments may be combined, the steps may be carried out in any order, and many other variations may be made to the different aspects of the present disclosure as described above, which are not provided in detail for the sake of brevity.

In addition, for simplicity of illustration and discussion and in order not to obscure the present disclosure, well-known power/ground connections to integrated circuit (IC) chips and other components are not shown in the accompanying drawings. Furthermore, in order to avoid obscuring the present disclosure, devices may be shown in block diagrams, which are also based on the fact that the details of the embodiments of the devices shown in the block diagrams are highly dependent on a platform on which the present disclosure is to be implemented (i.e., these details should be fully understood by those skilled in the art). In such a case that specific details (e.g. circuits) are described to describe the exemplary embodiments of the present disclosure, it will be apparent to those skilled in the art that the present disclosure may be practiced without these specific details or with the specific details being changed. Accordingly, the description should be considered as illustrative rather than restrictive.

Although the present disclosure has been described in conjunction with the specific embodiments, many alternatives, modifications and variations of these embodiments will be apparent to those skilled in the art. For example, other memory architectures (e.g. dynamic RAM (DRAM)) may be used in the embodiments discussed above.

The embodiments of the present disclosure are intended to cover all alternatives, modifications and variations that fall within the broad scope of the appended claims. Therefore, any omissions, modifications, equivalents, and improvements, which are made within the spirit and principles of the present disclosure, are intended to be included within the scope of the present disclosure.

The invention claimed is:

1. Transparent glass, comprising: a first glass layer, a plurality of transparent conductive strips, a second glass layer, and a temperature measuring structure on an edge of the glass,
   wherein the plurality of transparent conductive strips are between the first glass layer and the second glass layer and spaced apart from each other, and are configured to generate heat when being supplied with power,
   wherein the plurality of transparent conductive strips have a curved shape, and
   wherein the temperature measuring structure comprises a first transparent conductive temperature measuring strip and a second transparent conductive temperature measuring strip which are made of different conductive materials, one end of the first transparent conductive temperature measuring strip and one end of the second transparent conductive temperature measuring strip are overlapped and coupled, and at least one of the first transparent conductive temperature measuring strip and the second transparent conductive temperature measuring strip has a same shape as the plurality of transparent conductive strips and does not contact the plurality of transparent conductive strips.

2. The transparent glass of claim 1, further comprising a solar power unit between the plurality of transparent conductive strips and at least one of the first glass layer or the second glass layer.

3. The transparent glass of claim 2, wherein the solar power unit comprises a first electrode, a second electrode and a PIN junction between the first electrode and the second electrode.

4. The transparent glass of claim 2, comprising a plurality of solar power units, wherein the plurality of solar power units are arranged in an array of m rows and n columns, n solar power units in each row are coupled in series as a solar power unit string, m solar power unit strings are coupled in parallel with each other, and both m and n are natural numbers.

5. The transparent glass of claim 2, wherein the solar power unit is coupled to at least one of a power storage element or a power consumption element.

6. The transparent glass of claim 5, wherein the solar power unit is coupled to the plurality of transparent conductive strips.

7. The transparent glass of claim 2, further comprising a transparent insulating layer between the solar power unit and the plurality of transparent conductive strips.

8. The transparent glass of claim 1, wherein the first transparent conductive temperature measuring strip is made of indium tin oxide, and the second transparent conductive temperature measuring strip is made of antimony tin oxide.

9. The transparent glass of claim 1, wherein the plurality of transparent conductive strips are made of indium tin oxide.

10. The transparent glass of claim 1, further comprising a control circuit,
    wherein the control circuit is coupled to a power source and the temperature measuring structure, and
    the control circuit is configured to perform at least one of steps of:
      controlling the power source to apply a first type of control voltage to the plurality of transparent conductive strips to cause the plurality of transparent conductive strips to generate heat,
      controlling the power source to apply a second type of control voltage to the plurality of transparent conductive strips to cause the plurality of transparent conductive strips to generate a strong and weak alternating electric field, and
      controlling a magnitude of a control voltage applied to the plurality of transparent conductive strips according to a temperature of the glass measured by the temperature measuring structure.

11. A manufacturing method of transparent glass, comprising:
    forming a first glass layer;
    forming a plurality of transparent conductive strips on the first glass layer;
    forming a second glass layer on a side of the plurality of transparent conductive strips away from the first glass layer; and
    forming a temperature measuring structure on an edge of the glass,
    wherein forming the temperature measuring structure comprises:
      forming a first transparent conductive temperature measuring strip and a second transparent conductive temperature measuring strip from different conductive materials, one end of the first transparent conductive temperature measuring strip and one end of the second transparent conductive temperature measuring strip being overlapped and coupled,
    wherein the plurality of transparent conductive strips are spaced apart from each other, and are configured to generate heat when being supplied with power, and
    wherein the plurality of transparent conductive strips have a curved shape, and at least one of the first transparent conductive temperature measuring strip and the second transparent conductive temperature measuring strip has a same shape as the plurality of transparent conductive strips and does not contact the plurality of transparent conductive strips.

12. The manufacturing method of claim 11, after forming the plurality of transparent conductive strips on the first glass layer, further comprising:

forming a solar power unit on the side of the plurality of transparent conductive strips away from the first glass layer.

13. The manufacturing method of claim 12, wherein forming the solar power unit comprises:

forming a first electrode on the side of the plurality of transparent conductive strips away from the first glass layer;

forming a PIN junction on a side of the first electrode away from the plurality of transparent conductive strips; and forming a second electrode on a side of the PIN junction away from the first electrode.

14. The manufacturing method of claim 12, wherein forming the solar power unit comprises:

forming a plurality of solar power units, wherein the plurality of solar power units are arranged in an array of m rows and n columns, n solar power units in each row are coupled in series as a solar power unit string, m solar power unit strings are coupled in parallel with each other, and both m and n are natural numbers.

15. A control method of transparent glass, wherein the glass comprises a first glass layer, a plurality of transparent conductive strips, a second glass layer and a temperature measuring structure on an edge of the glass, the plurality of transparent conductive strips are located between the first glass layer and the second glass layer and spaced apart from each other, the plurality of transparent conductive strips have a curved shape, the temperature measuring structure comprises a first transparent conductive temperature measuring strip and a second transparent conductive temperature measuring strip which are made of different conductive materials, one end of the first transparent conductive temperature measuring strip and one end of the second transparent conductive temperature measuring strip are overlapped and coupled, and at least one of the first transparent conductive temperature measuring strip and the second transparent conductive temperature measuring strip has a same shape as the plurality of transparent conductive strips and does not contact the plurality of transparent conductive strips, and the control method comprises:

controlling a power source to apply a first type of control voltage to the plurality of transparent conductive strips to cause the plurality of transparent conductive strips to generate heat; and controlling the power source to apply a second type of control voltage to the plurality of transparent conductive strips to cause the plurality of transparent conductive strips to generate a strong and weak alternating electric field.

16. The control method of claim 15, further comprising:

controlling a magnitude of a control voltage applied to the plurality of transparent conductive strips according to a temperature of the transparent glass measured by the temperature measuring structure.

17. The control method of claim 16, wherein the transparent glass further comprises a solar power unit, and the control method further comprises:

disconnecting the power source from the plurality of transparent conductive strips, and coupling the solar power unit to a power storage element or a power consumption element;

applying a first type of control voltage to the plurality of transparent conductive strips by the power storage element or other power supply element to cause the plurality of transparent conductive strips to generate heat; and applying a second type of control voltage to the plurality of transparent conductive strips by the power storage element or other power supply element to cause the plurality of transparent conductive strips to generate a strong and weak alternating electric field.

* * * * *